(12) United States Patent
Sheng

(10) Patent No.: US 12,327,769 B2
(45) Date of Patent: Jun. 10, 2025

(54) METHOD FOR MANAGING CHIP MANUFACTURING EQUIPMENT, APPARATUS, ELECTRONIC DEVICE AND STORAGE MEDIUM

(71) Applicant: Saimeite Technology Co., Ltd., Jiangsu (CN)

(72) Inventor: Wang Sheng, Jiangsu (CN)

(73) Assignee: Saimeite Technology Co, Ltd., Jiangsu (CN)

( * ) Notice: Subject to any disclaimer, the term of this patent is extended or adjusted under 35 U.S.C. 154(b) by 514 days.

(21) Appl. No.: 17/900,699

(22) Filed: Aug. 31, 2022

(65) Prior Publication Data
US 2023/0207400 A1    Jun. 29, 2023

(30) Foreign Application Priority Data
Dec. 29, 2021    (CN) .......................... 202111640249.5

(51) Int. Cl.
*H01L 21/66*    (2006.01)
*H01L 21/67*    (2006.01)
*H01L 21/677*    (2006.01)

(52) U.S. Cl.
CPC ........ *H01L 22/20* (2013.01); *H01L 21/67109* (2013.01); *H01L 21/67276* (2013.01); *H01L 21/67766* (2013.01); *H01L 22/10* (2013.01); *Y02P 90/30* (2015.11)

(58) Field of Classification Search
CPC ......... H01L 22/20; H01L 22/26; H01L 22/10; H01L 22/12; H01L 21/67109; H01L 21/67766; H01L 21/67276; Y02P 90/30
See application file for complete search history.

(56) References Cited

U.S. PATENT DOCUMENTS

| | | | | |
|---|---|---|---|---|
| 7,406,644 | B2 * | 7/2008 | Kaushal | H01L 22/20 |
| | | | | 714/733 |
| 2006/0212156 | A1 * | 9/2006 | Tanaka | G05B 19/41865 |
| | | | | 700/121 |
| 2013/0186878 | A1 * | 7/2013 | Takahashi | H01L 21/67248 |
| | | | | 219/413 |
| 2021/0341342 | A1 * | 11/2021 | Qian | H01L 22/14 |
| 2023/0096518 | A1 * | 3/2023 | Vyas | H01L 21/67276 |
| | | | | 118/712 |
| 2023/0236583 | A1 * | 7/2023 | Zhang | H01L 21/67253 |

* cited by examiner

*Primary Examiner* — Michael M Trinh
(74) *Attorney, Agent, or Firm* — Davis Wright Tremaine LLP

(57) ABSTRACT

Provided are method for managing chip manufacturing equipment, apparatus, electronic device and storage medium. The method incudes: determining, for each furnace tube device in target area, processing precision of the furnace tube device, through a heating uniformity result of the furnace tube device, processing test result of test piece, and factory parameters and marking a processing precision label; determining, when it is detected that a first rule is set in first furnace tube device, a second furnace tube device having device capability same as the first furnace tube device, and determining a target second furnace tube device having processing precision label same as that required by the first rule; determining priority synchronization sequence of the target second furnace tube device according to the processing precision of the target second furnace tube device; and synchronizing the first rule to the target second furnace tube device according to the priority synchronization sequence.

9 Claims, 3 Drawing Sheets

METHOD FOR MANAGING CHIP MANUFACTURING EQUIPMENT, APPARATUS, ELECTRONIC DEVICE AND STORAGE MEDIUM

CROSS-REFERENCE TO RELATED APPLICATIONS

This application claims priority to Chinese Patent Application No. 202111640249.5, filed Dec. 29, 2021, entitled "METHOD FOR MANAGING CHIP MANUFACTURING EQUIPMENT, APPARATUS, ELECTRONIC DEVICE AND STORAGE MEDIUM," the disclosure of which is hereby incorporated herein in its entirety.

TECHNICAL FIELD

The present application relates to the technical field of chip manufacturing, and in particular, to a method for managing chip manufacturing equipment, apparatus, electronic device, and storage medium.

BACKGROUND ART

During the wafer manufacturing process, it is necessary to set processing rules for the processing device to ensure that the processing device can process different wafers under the constraints of the processing rules. If no processing rule is set for the processing device, it will cause the problems, such as, the processing device cannot be used. The inventor found during research that in the prior art, when setting rules for devices, it is necessary to set rules for each of devices individually, and it is impossible to synchronize rules among different devices with the same functions.

SUMMARY

In view of this, the embodiments of the present application provide a method for managing chip manufacturing equipment, apparatus, electronic device, and storage medium, so as to realize rule synchronization between different devices. In first aspect, an embodiment of the present application provides a method for managing chip manufacturing equipment, the method comprising:
  determining, for each furnace tube device in a target area, processing precision of the furnace tube device, through a heating uniformity result obtained by testing the furnace tube device, a processing test result after a test piece is processed by the furnace tube device, and factory parameters of the furnace tube device;
  marking a processing precision label for each furnace tube device according to the processing precision of each furnace tube device;
  determining, when it is detected that a first rule is set in a first furnace tube device, at least one second furnace tube device having device capability same as the first furnace tube device in the target area, wherein the first rule comprises: product categories that are allowed to be processed by the furnace tube device, and a processing precision label required for processing each of the product categories;
  determining, from the at least one second furnace tube device, a target second furnace tube device having a processing precision label same as that required by the first rule;
  determining a priority synchronization sequence of the target second furnace tube device according to the processing precision of each target second furnace tube device; and
  synchronizing the first rule in the first furnace tube device to the target second furnace tube device according to the priority synchronization sequence.

In a feasible embodiment, after synchronizing the first rule in the first furnace tube device to the target second furnace tube device, the method further comprises:
  judging whether the target furnace tube device can process the target product, for each target furnace tube device, according to a product category of the target product, a processing precision label of the target furnace tube device, the first rule in the target furnace tube device, carried in the execution request, when an execution request sent by the target furnace tube device is received, wherein the target furnace tube device comprises the first furnace tube device and the second furnace tube device; the execution request is generated after the target furnace tube device detects arrival of the target product; the product categories comprise product batch, product batch type, and product model; the processing precision label comprises a finishing label, and a rough processing label; and corresponding relationship between product category and processing precision requirement is preset; and
  controlling the target furnace tube device to execute a processing program, when it is judged that the target furnace tube device can process the target product.

In a feasible embodiment, when the first rule is of allowing the furnace tube device whose processing precision label is the finishing label to process products of the first product category, the method further comprises:
  controlling the target furnace tube device to process products of the first product category, for each target furnace tube device, when an execution request sent by the target furnace tube device is received, if a processing precision label of the target furnace tube device in the execution request is the finishing label and the product category of the target product received by the target furnace tube device is the same as the first product category.

In a feasible embodiment, when the execution request sent by the target furnace tube device is received, the method further comprises:
  controlling a transport robot to transfer the target product to make it leave the target furnace tube device, if the processing precision label of the target furnace tube device in the execution request is the rough processing label, or the product category of the target product received by the target furnace tube device is different from the first product category.

In a feasible embodiment, before detecting that the first rule is set in the first furnace tube device, the method further comprises:
  judging whether an additional special negative rule is in a negative rule, for each furnace tube device, when it is detected that the negative rule is in the furnace tube device, wherein the negative rule is that the furnace tube device is not allowed to process products of the second product category; and the special negative rule is that the amount of products of the second product category allowed to be processed by the furnace tube device is the first amount;
  determining a first amount in the special negative rule, in which the furnace tube device is allowed to process products of the second product category, if an additional special negative rule exists in the negative rule;

controlling the furnace tube device to process products of the second product category, when a second amount, in which the products of the second product category are processed by the furnace tube device within a preset period, is smaller than the first amount; and controlling the furnace tube device to stop processing the products of the second product category, when the second amount, in which the products of the second product category are processed by the furnace tube device within a preset period, is greater than or equal to the first amount.

In a feasible embodiment, before detecting that the first rule is set in the first furnace tube device, the method further comprises:

judging whether an additional exception rule is in the target rule, for each furnace tube device, when a target rule is set in the furnace tube device, wherein the target rule comprises a positive rule and a negative rule, and the positive rule is of allowing the furnace tube device to process products of the third product category;

determining a product batch and a product batch type in the product category specified in the exception rule, if the exception rule exists in the target rule, wherein the product model in the exception rule and the product model in the target rule are the same; and ignoring the target rule in this operation, if the product batch and the product batch type of the product to be processed are the same as the product batch and the product batch type specified in the exception rule.

In a feasible embodiment, before detecting that the first rule is set in the first furnace tube device, the method further comprises:

determining that the furnace tube device enters a testing stage after parameter adjustment, for each furnace tube device, if a super positive constraint rule exists in the furnace tube device, wherein the super positive constraint rule is of allowing the furnace tube device to process products whose batch type in product category is of test batch;

controlling the furnace tube device to process test products whose batch type is of a test batch, according to the product category specified in the super positive constraint rule, so as to obtain processing parameters of the test products, wherein the product category of the test products is the same as the product category specified in the super positive constraint rule;

adjusting the furnace tube device from the testing stage to a normal operation stage, when percentage of the number of processing parameters meeting a preset parameter requirement, in the total number of at least one processing parameter obtained within a preset time period, exceeds a preset threshold; and deleting the super positive constraint rule, when the furnace tube device is in the normal operation stage.

In the second aspect, the embodiments of the present application also provide an apparatus for managing chip manufacturing equipment, the apparatus comprising:

a calculating unit, configured to determine, for each furnace tube device in a target area, processing precision of the furnace tube device, through a heating uniformity result obtained by testing the furnace tube device, a processing test result of a test piece after processed by the furnace tube device, and factory parameters of the furnace tube device;

a marking unit, configured to mark a processing precision label for each furnace tube device according to the processing precision of each furnace tube device;

a second determining unit, configured to determine, when it is detected that a first rule is set in a first furnace tube device, at least one second furnace tube device having device capability same as the first furnace tube device in the target area, wherein the first rule comprises: product categories that are allowed to be processed by the furnace tube device, and a processing precision label required for processing each of the product categories;

a screening unit, configured to determine, from the at least one second furnace tube device, a target second furnace tube device having a processing precision label same as that required by the first rule;

a sorting unit, configured to determine a priority synchronization sequence of the target second furnace tube device according to the processing precision of each target second furnace tube device; and a synchronization unit, configured to synchronize the first rule in the first furnace tube device to the target second furnace tube device according to the priority synchronization sequence.

In a feasible embodiment, the apparatus further comprises:

a first judging unit, configured to judge, for each target furnace tube device, whether the target furnace tube device can process the target product, after synchronizing the first rule in the first furnace tube device to the target second furnace tube device, when receiving an execution request sent by the target furnace tube device, according to the product category of the target product, the processing precision label of the target furnace tube device, and the first rule in the target furnace tube device, carried in the execution request, wherein the target furnace tube device comprises the first furnace tube device and the second furnace tube device; the execution request is generated after the target furnace tube device detects arrival of the target product; the product category comprises a product batch, a product batch type, and a product model; the processing precision label comprises a finishing label and a rough processing label; and the corresponding relationship between the product category and the processing precision requirement is preset; and a first processing unit, configured to control the target furnace tube device to execute a processing program, when it is judged that the target furnace tube device can process the target product.

In a feasible embodiment, the apparatus further comprises:

a second processing unit, configured to control the target furnace tube device to process products of the first product category, for each target furnace tube device, when an execution request sent by the target furnace tube device is received, if a processing precision label of the target furnace tube device in the execution request is the finishing label and the product category of the target product received by the target furnace tube device is the same as the first product category, when the first rule is of allowing the furnace tube device whose processing precision label is the finishing label to process products of the first product category.

In a feasible embodiment, the apparatus further comprises:

a first control unit, configured to control a transport robot to transfer the target product to make it leave the target furnace tube device, if the processing precision label of the target furnace tube device in the execution request is the rough processing label, or the product category of the target product received by the target furnace tube device is different from the first product category, when receiving the execution request sent by the target furnace tube device.

In a feasible embodiment, the apparatus further comprises:
a second judging unit, configured to judge whether an additional special negative rule is in a negative rule, for each furnace tube device, when it is detected that the negative rule is in the furnace tube device, before it is detected that a first rule is set in the first furnace tube device, wherein the negative rule is that the furnace tube device is not allowed to process products of the second product category; and the special negative rule is that the amount of products of the second product category allowed to be processed by the furnace tube device is the first amount;
a third determining unit, configured to determine a first amount in the special negative rule, in which the furnace tube device is allowed to process products of the second product category, if an additional special negative rule exists in the negative rule;
a second control unit, configured to control the furnace tube device to process products of the second product category, when a second amount, in which the products of the second product category are processed by the furnace tube device within a preset period, is smaller than the first amount; and
a third control unit, configured to control the furnace tube device to stop processing the products of the second product category, when the second amount, in which the products of the second product category are processed by the furnace tube device within a preset period, is greater than or equal to the first amount.

In a feasible embodiment, the apparatus comprises:
a third judging unit, configured to judge whether an additional exception rule is in the target rule, for each furnace tube device, when a target rule is set in the furnace tube device, wherein the target rule comprises a positive rule and a negative rule, and the positive rule is of allowing the furnace tube device to process products of the third product category;
a fourth determining unit, configured to determine a product batch and a product batch type in the product category specified in the exception rule, if the exception rule exists in the target rule, wherein the product model in the exception rule and the product model in the target rule are the same; and
a rule masking unit, configured to ignore the target rule in this operation, if the product batch and the product batch type of the product to be processed are the same as the product batch and the product batch type specified in the exception rule.

In a feasible embodiment, the apparatus further comprises:
a fifth determining unit, configured to determine that the furnace tube device enters a testing stage after parameter adjustment, for each furnace tube device, if a super positive constraint rule exists in the furnace tube device, wherein the super positive constraint rule is of allowing the furnace tube device to process products whose batch type in product category is of test batch;
a fourth control unit, which controls the furnace tube device to process test products whose batch type is of a test batch, according to the product category specified in the super positive constraint rule, so as to obtain processing parameters of the test products, wherein the product category of the test products is the same as the product category specified in the super positive constraint rule;
an adjustment unit, configured to adjust the furnace tube device from the testing stage to a normal operation stage, when percentage of the number of processing parameters meeting a preset parameter requirement, in the total number of at least one processing parameter obtained within a preset time period, exceeds a preset threshold; and
a rule deletion unit, configured to delete the super positive constraint rule, when the furnace tube device is in the normal operation stage.

In the third aspect, embodiments of the present application also provide an electronic device, comprising: a processor, a storage medium, and a bus, wherein the storage medium stores machine-readable instructions executable by the processor, wherein when the electronic device is running, the processor is communicated with the storage medium through the bus, and the processor executes the machine-readable instructions to execute steps of the method according to any one of the first aspect.

In the fourth aspect, embodiments of the present application also provide a computer-readable storage medium, wherein a computer program is stored on the computer-readable storage medium, and when the computer program is executed by the processor, steps of the method according to any one of the first aspect.

In the method for managing chip manufacturing equipment, apparatus, electronic equipment, and storage medium provided by the embodiments of the present application, for each furnace tube device in a target area, the processing precision of each furnace tube device is calculated through the heating uniformity result obtained by testing the furnace tube device, a processing test result of a test piece after processed by the furnace tube device, and factory parameters of the furnace tube device, so that after the processing precision of the furnace tube device is obtained, the processing precision label of each furnace tube device is determined. After it is detected that the first rule is set in the first furnace tube device, by determining at least one second furnace tube device in the target area with the device capability same as the first furnace tube device, a target second furnace tube device with the processing precision label same as that required by the first rule is determined from the at least one second furnace tube device, and then the priority synchronization sequence of the target second furnace tube device is determined according to the processing precision of each of the target second furnace tube devices. According to the priority synchronization sequence, the first rule in the first furnace tube device is synchronized to the target second furnace tube device.

In the method provided in the embodiment of the present application, the processing precision of each furnace tube device is calculated through the heating uniformity result obtained by testing the furnace tube device, a processing test result of a test piece after processed by the furnace tube device, and factory parameters of the furnace tube device. Through the processing precision label of each furnace tube device, when the rule is synchronized, the first rule in the first furnace tube device can be synchronized to the target furnace tube device in equipment that meets the requirements of the processing precision label. Through determining the priority synchronization sequence of the target second furnace tube device, the first rule can be preferentially synchronized to the target second furnace tube device with relatively higher processing precision. Compared with the method in which a rule is separately set for each device in the prior art, the technical solution provided by embodiments of the present application can realize the rule synchronization between different devices.

In order to make the above-mentioned objects, features and advantages of the present application more obvious and easy to be understood, the preferred embodiments are exemplified below, and are described in detail as follows in conjunction with the drawings.

BRIEF DESCRIPTION OF DRAWINGS

In order to illustrate the technical solutions of the embodiments of the present application more clearly, drawings that need to be used in the embodiments will be briefly introduced as follows. It should be understood that the following drawings only show some embodiments of the present application, and therefore should not be regarded as a limitation on the scope. For those ordinarily skilled in the art, other related drawings can also be obtained according to these drawings without any creative efforts.

DETAILED DESCRIPTION OF EMBODIMENTS

Figure 1:
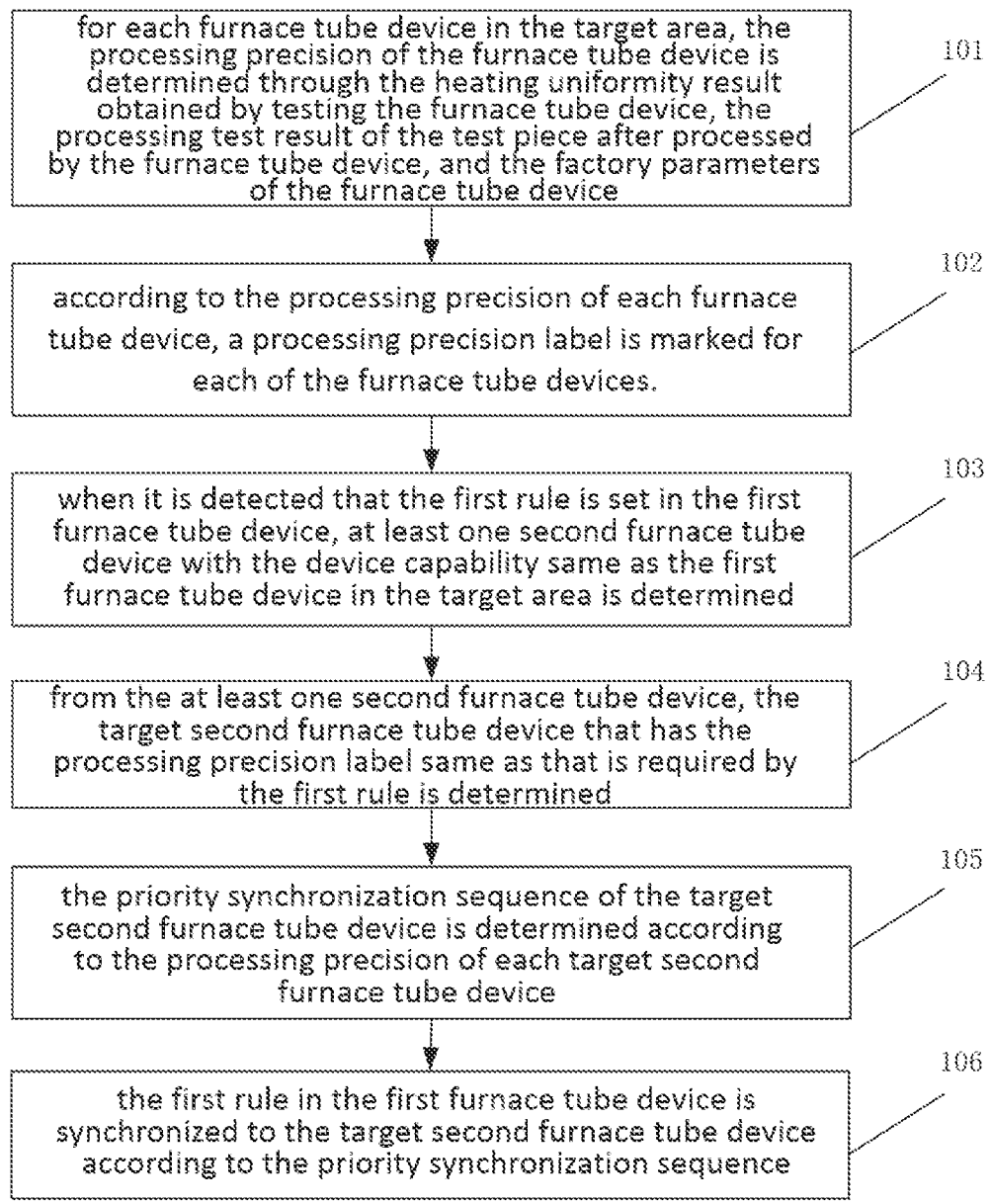
FIG. 1 shows a flowchart of a method for managing chip manufacturing equipment provided by an embodiment of the present application.

In order to make the purposes, technical solutions and advantages of the embodiments of the present application clearer, the technical solutions of the embodiments of the present application will be described clearly and completely below with reference to the drawings in the embodiments of the present application. It should be understood that the drawings in the present application are only for the purpose of illustration and description, and are not used to limit the protection scope of the present application. In addition, it should be understood that the schematic drawings are not drawn in scale. The flowcharts used in the present application illustrate operations implemented in accordance with some embodiments of the present application. It should be understood that the operations of the flowcharts may be performed out of order, and the steps in context without logical relationship may be performed in reverse order or concurrently. In addition, those skilled in the art can add one or more other operations to the flowchart, and can also remove one or more operations from the flowchart under the guidance of the content of the present application.

In addition, the described embodiments are only some of the embodiments of the present application, but not all of them. Generally, the components of the embodiments of the present application described and illustrated in the drawings herein may be arranged and designed in a variety of different configurations. Thus, the following detailed description on the embodiments of the present application provided in the drawings is not intended to limit the scope of the present application as claimed, but is merely representative of selected embodiments of the present application. Based on the embodiments of the present application, all other embodiments, which are obtained by those skilled in the art without creative work, fall within the protection scope of the present application.

It should be noted in advance that the term "comprising", which will be used in the embodiments of the present application, is to indicate the existence of features defined by it, but does not exclude the addition of other features.

It should be noted in advance that, the devices or electronic devices, etc. involved in the embodiments of the present application may be executed on a single server, or may be executed on a server group. The server group can be centralized or distributed. In some embodiments, the server may be local or remote relative to the terminal. For example, a server may access information and/or data stored in a service requester terminal, a service provider terminal, or a database, or any combination thereof, via a network. As another example, the server may connect directly to at least one of a service requester terminal, a service provider terminal and a database to access stored information and/or data. In some embodiments, the server may be implemented on a cloud platform. As example only, the cloud platform may comprise private cloud, public cloud, hybrid cloud, community cloud, distributed cloud, inter-cloud, multi-cloud, etc., or any combination of them.

FIG. 1 shows a flowchart of a method for managing chip manufacturing equipment provided by an embodiment of the present application. As shown in FIG. 1, the method comprises the following steps:

Step 101, in which for each furnace tube device in the target area, the processing precision of the furnace tube device is determined through the heating uniformity result obtained by testing the furnace tube device, the processing test result of the test piece after processed by the furnace tube device, and the factory parameters of the furnace tube device.

Specifically, the furnace tube device is the process chamber of the vertical oxidation furnace. In the process of chip manufacturing, it is mainly used for high-temperature oxidation and diffusion of the wafer, and an insulating layer is formed on the surface of the wafer. The most important parameter of the furnace tube is the temperature parameter. The temperature parameters, which can be achieved by the furnace tube device when heating, determine the processing precision. The target area can be determined according to actual needs. It can comprise one device or multiple devices. Herein, the devices in different target areas may be the same or different. For example, each of the devices in the first target area is the furnace tube device; each of the devices in the second target area is the polishing device; each of the devices in the third target area is the furnace tube device, and each of the devices in the fourth target area is the grinding device.

When the vertical oxidation furnace is heating, if the temperature difference in every two arbitrary areas in the furnace tube can be stabilized within a small range, the heating uniformity of the furnace tube will be better and the processing precision will be higher. The test piece is a sample used to test whether the furnace tube device can meet the processing requirements before the furnace tube device is used for mass production. The test pieces in preset number are processed by the furnace tube device to obtain the processed samples after processing. Each processed sample is measured to obtain the processing test results. It is according to the processing test results actually obtained. The factory parameters of furnace tube device comprise the model, brand, working temperature range, precision, device stability, etc. of the equipment issued by the manufacturer. The factory parameters, the heating uniformity result and the processing test result are used as three indicators to determine the processing precision of furnace tube device, and weights are respectively set for the above three indicators to obtain the processing precision of each furnace tube device.

It should be noted that the embodiments of the present application are described based on furnace tube device, but the embodiments of the present application can also be applied to other processes in the chip manufacturing process. For example, when the furnace tube device is replaced by the polishing device, since the important parameter of the polishing device is the polishing uniformity, the processing precision of the polishing device is determined according to the polishing uniformity result, the processing test results of the test piece after processed by the polishing device, and the factory parameters of the polishing device.

Step 102, according to the processing precision of each furnace tube device, a processing precision label is marked for each of the furnace tube devices.

Specifically, after calculating the processing precision of each furnace tube device in step 101, a processing precision label is marked according to the processing precision value of each furnace tube device. The processing precision label comprises a finishing label and a rough processing label. The furnace tube device whose processing precision is greater than or equal to the preset finishing precision value is marked with a finishing label, and the furnace tube device whose processing precision is smaller than the finishing precision value but greater than or equal to the rough processing precision value is marked with a rough processing label. It should be noted that if the processing precision of the furnace tube device is smaller than the rough processing precision value, the furnace tube device will be marked with an abnormal state label, and it needs to be adjusted, maintained or repaired again.

It should be noted that in practical applications, the processing precision corresponding to each furnace tube device can be divided according to the above "finishing label" and "rough processing label", but also according to ten different grades of "1-10", which is a multi-level precise division, wherein the device carrying the identification of "level 1" has the lowest processing precision, and the device carrying the identification of "level 10" has the highest processing precision. When dividing the processing precisions of the devices according to the level of "1-10", the processing precision of the furnace tube device is specifically determined by "the factory precision of the device, the heating uniformity result obtained by testing the furnace tube device, the processing test results, and the factory parameters of the furnace tube device".

Step 103, in which when it is detected that the first rule is set in the first furnace tube device, at least one second furnace tube device with the device capability same as the first furnace tube device in the target area is determined, wherein the first rule comprises: product categories allowed to be processed by the furnace tube device, and processing precision label required for processing each of the product categories.

Specifically, the device capability refers to the specific processing purpose of the device in the chip manufacturing process. For example, when the target area comprises a furnace tube device, a polishing device and other processing devices, the device capabilities of individual furnace tube devices are the same, and all of them are used for oxidizing wafers at high temperature. The device capability of each polishing device is the same, and all of them are used for polishing and sanding.

Whether there is a newly added rule in each furnace tube device is detected. When it is detected that a new first rule is set in the first furnace tube device, the second furnace tube device in the target area that has the device capability same as the first furnace tube device is determined. The first rule is set by the user to determine the processing authority of each furnace tube device, including the product categories that can be processed and the processing precision levels that can be achieved for products of different product categories.

As for Example 1, the target area comprises Device 1, Device 2, Device 3, and Device 4, wherein Device 1, Device 2, Device 3 are furnace tube devices, and Device 4 is a polishing device. Device 1 is selected as the first furnace tube device. When the first rule is set for the first furnace tube device, it is determined that the devices with the device capability same as the Device 1 are Device 2 and Device 3.

The first rule can be set as: allowing to process the products A which have the batch type as test batch and the batch sequence of the second batch and furnace tube device being marked with a finishing label. Herein, "test batch", "second batch", and "product A" respectively represent the batch type, product batch, and product model of the products in the product category. It should be noted that the processing precision label of Device 1 can be a finishing label or a rough processing label. When the label of the first furnace tube device is a rough processing label, the first furnace tube device does not meet the standard required by the first rule, "furnace tube device being marked with a finishing label", and then the first furnace tube device cannot process the products A for which the batch type is the test batch and the batch sequence is the second batch. When the first furnace tube device, after undergoing the parameter adjustment or testing or running in increased amount, Step 101 is performed again to calculate the processing precision of the first furnace tube device, and the rough processing label of the first furnace tube device is changed to the finishing label according to the newly calculated processing precision, the first furnace tube device can process the products A for which the batch type is the test batch and the batch sequence is the second batch.

Step 104, in which from the at least one second furnace tube device, the target second furnace tube device that has the processing precision label same as that is required by the first rule is determined.

Specifically, the processing precision labels of the first furnace tube device and the second furnace tube device are both obtained after Step 102. First it determines each second furnace tube device with the device capability same as that of the first furnace tube device, and then determines the processing precision label of each second furnace tube device, and uses the second furnace tube device with the processing precision label same as that required by the first rule in individual second furnace tube devices, as the target second furnace tube device.

As for Example 2, as the example shown in Example 1, it is assumed that the processing precision labels of Device 2 and Device 3 are respectively "finishing label" and "rough processing label".

As shown in Example 1, for the first rule, Device 2 and Device 3 are both the second furnace tube device, and the target second furnace tube device that meets the requirement of the first rule, "furnace tube device being marked with a finishing label" is "Device 2".

Step 105, in which the priority synchronization sequence of the target second furnace tube device is determined according to the processing precision of each target second furnace tube device.

Specifically, after determining according to step 104 the target second furnace tube devices with the processing precision label same as that required by the first rule, they are sorted from large to small according to the specific numerical value of the processing precision of each target furnace tube device, and the device with the highest processing precision is listed as the device with the first priority synchronization sequence, and the priority synchronization sequence of the target second furnace tube device is determined.

Step 106, in which the first rule in the first furnace tube device is synchronized to the target second furnace tube device according to the priority synchronization sequence.

Specifically, the priority synchronization sequence of the target second furnace tube device is determined according to Step 105, and the first rule is preferentially synchronized in the target second furnace tube device with a higher processing precision value, so as to ensure the efficiency and effectiveness of the synchronization.

A method for managing chip manufacturing equipment is provided by an embodiment of the present application. For each furnace tube device in a target area, the processing precision of each furnace tube device is calculated based on the heating uniformity result obtained by testing the furnace tube device, the processing test result of the test piece after processed by the furnace tube device and the factory parameters of the furnace tube device, so that after obtaining the processing precision of the furnace tube device, the processing precision label of each furnace tube device is determined. After it is detected that the first rule is set in the first furnace tube device, a target second furnace tube device with the processing precision label same as that required by the first rule is determined from at least one second furnace tube device through determining at least one second furnace tube device in the target area with the device capability same as the first furnace tube device, and then the priority synchronization sequence of the target second furnace tube device is determined according to the processing precision of each of the target second furnace tube devices, and the first rule in the first furnace tube device is synchronized to the target second furnace tube device according to the priority synchronization sequence.

In the method provided in the embodiments of the present application, the processing precision of each furnace tube device is calculated through the heating uniformity result obtained by testing the furnace tube device, the processing test result of the test piece after processed by the furnace tube device, and the factory parameters of the furnace tube device. Through the processing precision label for each furnace tube device, when the rules are synchronized, the first rule in the first furnace tube device can be synchronized to the target furnace tube device in the equipment that meets the requirements of the processing precision label. Through determining the priority synchronization sequence of the target second furnace tube device, the first rule can be preferentially synchronized to the target second furnace tube device with relatively higher processing precision. Compared with the method of separately setting rules for each device in the prior art, the technical solution of the present application can realize the rule synchronization between different devices.

In a feasible embodiment, after synchronizing the first rule in the first furnace tube device to the target second furnace tube device, the method further comprises the following steps.

For each target furnace tube device, when an execution request sent by the target furnace tube device is received, it is judged whether the furnace tube device can process the target product according to the product category of the target product, the processing precision label of the target furnace tube device, and the first rule in the target furnace tube device carried in the execution request. The target furnace tube device comprises the first furnace tube device and the second furnace tube device. The execution request is generated after the target furnace tube device detects the arrival of the target product. The product category comprises the product batch, the product batch type, and the product model. The processing precision label comprises a finishing label and a rough processing label. The corresponding relationship between product category and the processing precision requirement is preset. When the product category of the target product and the processing precision label of the target furnace tube device meet the first rule, the furnace tube device is controlled to process the target product.

Specifically, according to at least one rule set in each target furnace tube device, the system transports to the target position of the target furnace tube device the target product that can be processed by the target furnace tube device under the constraint of each rule.

When it is detected that the target product exists in the target area in the target furnace tube device, the code on the carrier for loading the target product is obtained. The batch, the batch type, and the product model of the target product loaded in the carrier corresponding to the code are obtained according to the code. Based on the obtained code, the first rule stored in the own device and the own processing precision label, it sends to the system an execution request for processing the target product. When the system receives the execution request sent by the target furnace tube device, it judges whether the target furnace tube device can process the target product according to the code in the execution request and the first rule of the target furnace tube device. When it is determined that the target furnace tube device can process the target product, the target furnace tube device is controlled to execute a processing program. In the embodiment of the present application, the processing program of the target furnace tube device is the high-temperature oxidation program; and the processing program of the polishing device is the polishing program, and the other processing programs of chip manufacturing equipment are possible.

It should be noted that the system does not transport the target product to the target furnace tube device with no rule set. The target furnace tube device can directly send the execution request carrying the code to the system in the execution request, and can also obtain the batch, batch type, and product model of the target product according to the code, and send to the system the execution request carrying the batch, batch type and product model of the target produce. When there are plural rules in the target furnace tube device, a priority is set for each of the rules, so as to determine whether the target furnace tube device can process the target product according to the priority. The product categories comprise but are not limited to: product production process, processing precision requirements, process steps, product batches, formula, customers, and product batch types.

In a feasible embodiment, when the first rule is of allowing the furnace tube device whose processing precision label is the finishing label to process products of the first product category, the method further comprises the following steps.

For each target furnace tube device, when an execution request sent by the target furnace tube device is received, if the processing precision label of the target furnace tube device in the execution request is the finishing label, and the product category of the target product received by the target furnace tube device is the same as the first product category, the target furnace tube device is controlled to process the products of the first product category.

Specifically, the product category consists of the batch, batch type, and product model of the product. When setting the first rule, and when the first rule is of allowing the furnace tube device whose processing precision label is the finishing label to process the products of the first product category, the setting methods of the first product category comprise but are not limited to:

Setting Method 1, in which the product category is B; the product batch type is the mass production batch; and the product batch is 1-100;

Setting Method 2, in which the product category is B; the product batch type is the test batch and mass production batch; and the product batch is 1.

It can be seen that the first product category is not limited to one or a batch of target products. When the product category of the target product received by the target furnace tube device belongs to the range specified by the first product category, it is determined that the product category of the target products received by the target furnace tube device is the same as the first product category.

As for Example 3, when the first product category is set using Setting Method 1, it is assumed that the product category of the target product is: product category: B; product batch type: mass production batch; and product batch: 20, then it is determined that the product category of the target product received by the target furnace tube device is the same as the first product category.

In a feasible embodiment, when receiving the execution request sent by the target furnace tube device, the method further comprises the following steps.

If the processing precision label of the target furnace tube device in the execution request is the rough processing label, or the product category of the target product received by the target furnace tube device is different from the first product category, the transport robot is controlled to transfer the target product to make it leave the target furnace tube device.

Specifically, when the first product category is set using Setting Method 2, it is assumed that the product category of the target product is: product category: B; product batch type: mass production batch; and product batch: 20. Since the product batch required in Setting Method 2 is 1, it is determined that the product category of the target product received by the target furnace tube device is different from the first product category.

Figure 2:
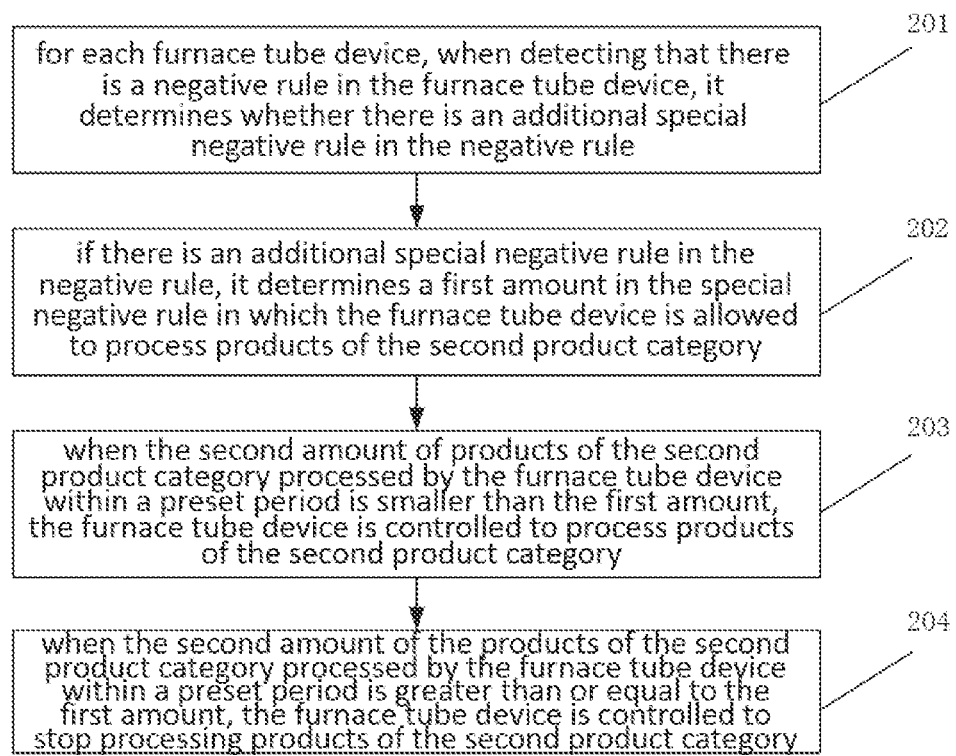
FIG. 2 shows a flowchart of a method for controlling the processing of device provided by an embodiment of the present application.

In a feasible embodiment, FIG. 2 shows a flowchart of a method for controlling processing of a device provided in the embodiment of the present application. As shown in FIG. 2, before it is detected that a first rule is set in the first furnace tube device, the method further comprises the following steps.

Step 201, in which for each furnace tube device, when detecting that there is a negative rule in the furnace tube device, it determines whether there is an additional special negative rule in the negative rule, wherein the negative rule is of not allowing the furnace tube device to process products of the second product category; and the special negative rule is that the amount of products of the second product category allowed to be processed by the furnace tube device is the first amount.

Specifically, the second product category can be adjusted according to actual conditions. When a negative rule that does not allow the furnace tube device to process products of the second product category is set in the furnace tube device, it is judged whether a special negative rule is added to the negative rule. For the furnace tube device, when a negative rule is set in the device, it means that all of other products can be processed except for the product categories limited in the negative rule. The product categories limited in the special negative rule comprise but are not limited to: product production process, processing precision requirement, process steps, batches, formula, customers, batch types, etc. If special conditions are also added, the special conditions comprise but are not limited to: the date allowing production and the quantity allowed to be produced.

Step 202, in which if there is an additional special negative rule in the negative rule, it determines a first amount in the special negative rule in which the furnace tube device is allowed to process products of the second product category.

Specifically, if a special negative rule is added to the negative rule, it indicates that the furnace tube device can process the products of the second product category whose amount is the first amount, and then the first amount is obtained. The first amount can be set according to the actual situation.

Step 203, in which when the second amount of products of the second product category processed by the furnace tube device within a preset period is smaller than the first amount, the furnace tube device is controlled to process products of the second product category.

Specifically, when a special negative rule is added to the negative rule, under the constraint of the special negative rule, when the amount of products of the second product category processed by the furnace tube device in the preset period is equal to the first amount, the negative rule takes effect; when the amount of products of the second product category processed by the furnace tube device within the preset period is smaller than the first amount, the negative rule becomes invalid. Herein, the invalidation of the negative rule means that the constraints of the negative rule do not restrict the furnace tube device. For example, when the negative rule is that the furnace tube device is not allowed to process products of the second product category, the furnace tube device is capable of processing products of the second product category after the negative rule is invalidated. The taking-effect of the negative rule means that the constraint of the negative rule has a restrictive effect on the furnace tube device. After the negative rule takes effect, the furnace tube device cannot process the products of the second product category. It should be noted that in the embodiments of the present application, the processing that is performed according to the negative rule or the special negative rule added to the negative rule is mentioned, which is for the purpose of introducing the relationship between the above negative rule and the special negative rule and the restraining ability to the device. It is controlled when the furnace tube device only contains this negative rule (and the special negative rule added to this negative rule). If the furnace tube device also comprises other negative rules, positive rules, super positive constraint rules, etc., in addition to this negative rule, it is necessary to comprehensively consider all the constraints to control the start and stop of the device.

Step 204, in which when the second amount of the products of the second product category processed by the furnace tube device within a preset period is greater than or equal to the first amount, the furnace tube device is controlled to stop processing products of the second product category.

Specifically, the number of times that the furnace tube device processes the products of the second product category in a preset period is accumulated to obtain a second amount. When the second amount is equal to or greater than the first amount, the negative rule, "the furnace tube device is not allowed to process products of the second product category", takes effect, and then the furnace tube device is controlled to stop processing the products of the second product category.

In a feasible embodiment, before detecting that the first rule is set in the first furnace tube device, the method further comprises the following steps.

Step 211, in which for each furnace tube device, when a target rule is set in the furnace tube device, it is judged whether there is an additional exception rule in the target rule, wherein the target rule comprises a positive rule and a negative rule, and the positive rule is of allowing the furnace tube device to process products of a third product category.

Specifically, when the rules set in the device are positive rules, it means that only products of the third product category defined by the positive rule can be processed in the device, and the range of product categories specified in the exception rule is smaller than or equal to the third product category. When the rule set in the device is a negative rule, it means that the device cannot process products of the second product category defined by the negative rule, and the range of the product category specified in the exception rule is smaller than or equal to the second product category.

Step 212, in which if the exception rule exists in the target rule, it determines the product batch and product batch type in the product category specified in the exception rule, wherein the product model in the exception rule is the same as the product model in the target rule.

Step 213, in which if the product batch and product batch type of the product to be processed are the same as the product batch and product batch type specified in the exception rule, the target rule is ignored in this operation.

Specifically, when the target rule is a positive rule, the exception rule is that it is not allowed to process some of all products that are allowed to be processed in the positive rule. When the target rule is a negative rule, the exception rule is of allowing to process some of all products that are not allowed to be processed under the negative rule.

In Example 4, assuming that the target rule is a negative rule, the negative rule is that "the furnace tube device is not allowed to process the products with the product model A, the batch type of mass production batch, and the product batches from 1 to 100". The exception rule is of "allowing furnace tube device to process the products with the product model A, the batch type of mass production batch, and the product batch of 1", and then when the furnace tube device is processing "products with product model A, the batch type of mass production batch, and the product batch of 1", the requirement of the negative rule is ignored, that is, the furnace tube device is allowed to process the current products with "product model A, batch type of mass production batch, and product batch of 1".

In a feasible embodiment, before detecting that the first rule is set in the first furnace tube device, the method further comprises the following steps.

Step 221, in which for each furnace tube device, if there is a super positive constraint rule in the furnace tube device, it determines that the furnace tube device enters the testing stage after the parameter adjustment, wherein the super positive constraint rule is of allowing the furnace tube device to process products whose batch type in the product category is a test batch.

Specifically, the super positive constraint rule is set for the device after the device is modified, parameter-adjusted or maintained. After the furnace tube device is modified, parameter-adjusted or maintained, it is not allowed to set, for the device, arbitrary rules other than the super positive constraint rule, so as to ensure that the furnace tube device can only produce the test products defined in the super positive constraint rule, and will not process a large number of products, preventing the products with low precision from being produced. When there is a super positive constraint rule in the furnace tube device, it is determined that the device is in the testing stage.

Step 222, in which the furnace tube device is controlled to process the test products whose batch type is a test batch, according to the product category specified in the super positive constraint rule, so as to obtain the processing parameters of the test product. The product category of the test product is the same as that specified in the super positive constraint rule. It should be noted that if the product category specified in the super positive constraint rule conflicts with the product category specified in the negative rule in the furnace tube device, the priority of the negative rule is higher than that of the super positive constraint rule, that is, the products of conflicting product categories are not processed.

Specifically, the test product is the product received by the furnace tube device. When it is determined that the furnace tube device has entered the testing stage, the received test product whose batch type is a test batch is processed, according to the product category specified in the super positive constraint rule and the processing precision label required for the product category, so as to obtain the processed test product and the processing parameters of the processed test product.

Step 223, in which when the percentage of the number of processing parameters that meet the preset parameter requirement, in total number of the at least one processing parameter obtained within the preset time period, exceeds a preset threshold, the furnace tube device is adjusted from the testing stage to the normal operation stage.

Specifically, the preset parameter requirement comprises the finishing and the rough processing, and the processing parameters of the preset parameter requirement comprise finishing precision and rough processing precision. The total number of processing parameters is the total number of at least one processing parameter obtained within the preset time period. When the percentage of the number of processing parameters that meet the preset parameter requirement, in the total number of processing parameters exceeds the preset threshold, it is determined that the furnace tube device can enter the normal operation state, and the testing stage is adjusted to the normal operation stage.

Step 224, when the furnace tube device is in a normal operation stage, the super positive constraint rule is deleted.

Specifically, after the super positive constraint rule is deleted, the furnace tube device is controlled to perform processing action according to the priority of each rule in the furnace tube device.

It should be noted that the control situation of the furnace tube device under different rule constraints is described above. If both positive and negative rules exist in the furnace tube device, the confirmation process before the processing is as follows.

Process 1, in which it determines each negative rule in the furnace tube device.

Process 2, in which for each negative rule, it is judged whether an exception rule is set for the negative rule, wherein if an exception rule is set for the negative rule, the products of the specific type specified in the exception rule is deemed as producible products, i.e. in any case, the constraint of the negative rule on the products of specific type is considered invalid.

Process 3, in which it is judged whether there is a super positive constraint rule.

If there is a super positive constraint rule, the products of the product category specified in the super positive constraint rule will be processed based on each negative rule confirmed in the above process. If the product category specified in the super positive constraint rule conflicts with the product category specified in the negative rule, the priority of the negative rule is higher than that of the super positive constraint rule, that is, the products of the conflicting product category will not be processed. After the processing is complete, the process ends.

Process 4, in which if no super positive constraint rule, then for each negative rule, it is judged whether a special negative rule is added to the negative rule.

For each negative rule to which a special negative rule is added, a first amount of products of the second product category that is allowed to be processed by the furnace tube device in each special negative rule is determined.

Process 5, in which it determines the positive rules in the furnace tube device and the product categories allowed to be processed by the positive rule.

Process 6, in which it determines the first condition: the product categories that are not allowed to be processed in each negative rule (products of the specific type in the exception rule are excluded, and the products of the second product category that are allowed to be processed are in the first amount); and it determines the second condition: the product category that is allowed to be processed in the positive rule. The products that meet both the first and second conditions are processed. After the processing is complete, the process ends.

It should be noted that if the product category specified in the positive rule conflicts with the product category specified in the negative rule, the priority of the negative rule is higher than that of the positive rule, that is, the products of the conflicting product category will not be processed. When the rules conflict with each other, the priority of the negative rule is higher than those of the positive rule, the super positive constraint rule and the exception rule added to the positive rule; but the priority of the negative rule cannot be higher than the special negative rule and the exception rule added to itself.

Figure 3:
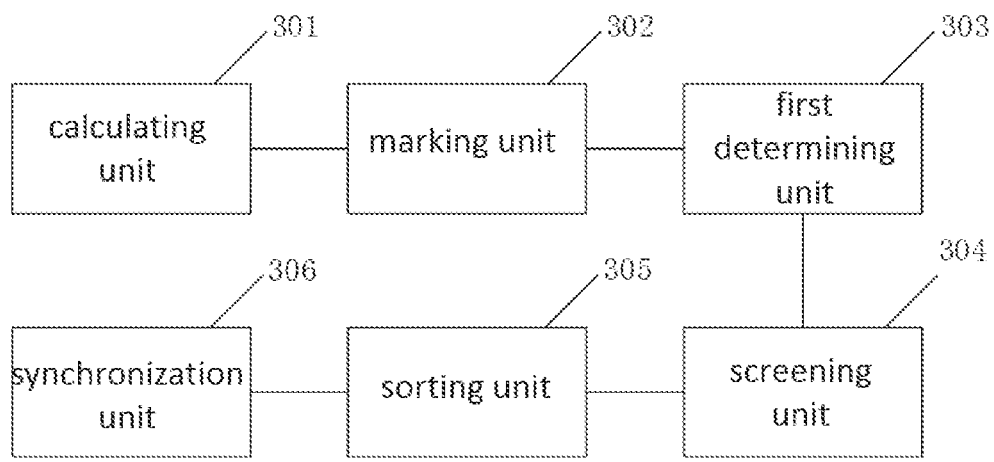
FIG. 3 shows a schematic structural diagram of an apparatus of managing chip manufacturing equipment provided by an embodiment of the present application.

FIG. 3 shows a schematic structural diagram of the apparatus for managing chip manufacturing equipment provided by an embodiment of the present application. As shown in FIG. 3, the apparatus comprises: a calculating unit 301, a marking unit 302, a first determining unit 303, a screening unit 304, a sorting unit 305, and a synchronization unit 306.

The calculating unit 301 is configured to determine the processing precision of the furnace tube device, for each furnace tube device in the target area, through the heating uniformity result obtained by testing the furnace tube device, the processing test result of the test piece after processed by the furnace tube device, and the factory parameters of the furnace tube device.

The marking unit 302 is configured to mark a processing precision label for each of the furnace tube devices according to the processing precision of each of the furnace tube devices.

The first determining unit 303 is configured to determine at least one second furnace tube device in the target area, which has the device capability same as that of the first furnace tube device when it is detected that the first rule is set in the first furnace tube device, wherein the first rule comprises: a product category allowed to be processed by the furnace tube device, and a processing precision label required for processing each of the product categories.

The screening unit 304 is configured to determine, from the at least one second furnace tube device, a target second furnace tube device that has the processing precision label same as that required by the first rule.

The sorting unit 305 is configured to determine the priority synchronization sequence of the target second furnace tube device according to the processing precision of each target second furnace tube device.

The synchronization unit 306 is configured to synchronize the first rule in the first furnace tube device to the target second furnace tube device according to the priority synchronization sequence.

The apparatus also comprises:
   a first judging unit, configured to judge whether the target furnace tube device can process the target product according to the product category of the target product, the processing precision label of the target furnace tube device, and the first rule in the target furnace tube device carried in the execution request, for each target furnace tube device, when receiving an execution request sent by the target furnace tube device, after synchronizing the first rule in the first furnace tube device to the target second furnace tube device, wherein the target furnace tube device comprises the first furnace tube device and the second furnace tube device; the execution request is generated after the target furnace tube device detects arrival of the target product; the product category comprises the product batch, the product batch type, and the product model; the processing precision label comprises the finishing label and the rough processing label; and the corresponding relationship between the product category and the processing precision requirement is preset.

The first processing unit is configured to control the target furnace tube device to execute a processing program when it is judged that the target furnace tube device can process the target product.

In a feasible embodiment, the apparatus further comprises:
   a second processing unit, configured to control the target furnace tube device to process products of the first product category, for each target furnace tube device, when the first rule is of allowing the furnace tube device whose processing precision label is the finishing label to process products of the first product category, when receiving the execution request sent by the target furnace tube device, if the processing precision label of the target furnace tube device in the execution request is the finishing label and the product category of the target product received by the target furnace tube device is the same as the first product category.

In a feasible embodiment, the apparatus further comprises:

a first control unit, configured to control the transport robot to transport the target product and make it leave the target furnace tube device, when receiving the execution request sent by the target furnace tube device, if the processing precision label of the target furnace tube device in the execution request is the rough processing label or the product category of the target product received by the target furnace tube device is different from the first product category.

In a feasible embodiment, the apparatus further comprises:

a second judging unit, configured to judge whether there is an additional special negative rule in the negative rule, for each furnace tube device, when it is detected that a negative rule is in the furnace tube device, before detecting that the first rule is set in the first furnace tube device, wherein the negative rule is that the furnace tube device is not allowed to process products of the second product category; and the special negative rule is that the amount in which the furnace tube device is allowed to process the products of the second product category is the first amount;

a third determining unit, configured to determine the first amount in which the furnace tube device is allowed to process the products of the second product category in the special negative rule, if there is the additional special negative rule in the negative rule;

a second control unit, configured to control the furnace tube device to process the products of the second product category, when the second amount in which the furnace tube device processes the products of the second product category within a preset period is smaller than the first amount; and a third control unit, configured to control the furnace tube device to stop processing the products of the second product category, when the second amount in which the furnace tube device processes the products of the second product category within a preset period is greater than or equal to the first amount.

In a feasible embodiment, the apparatus comprises:

a third judging unit, configured to judge whether there is an additional exception rule in the target rule, for each furnace tube device, when a target rule is set in the furnace tube device, wherein the target rule comprises a positive rule and a negative rule and the positive rule is of allowing the furnace tube device to process products of the third product category;

a fourth determining unit, configured to determine the product batch and the product batch type in the product category specified in the exception rule, if the exception rule exists in the target rule, wherein the product model in the exception rule is the same as the product model in the target rule; and a rule masking unit, configured to ignore the target rule in this operation, if the product batch and the product batch type of the product to be processed are the same as the product batch and the product batch type specified in the exception rule.

In a feasible embodiment, the apparatus further comprises:

a fifth determining unit, configured to determine that the furnace tube device enters the testing stage after parameter adjustment, for each furnace tube device, if there is a super positive constraint rule in the furnace tube device, wherein the super positive constraint rule is of allowing the furnace tube device to process the product whose the batch type in the product category is a test batch;

a fourth control unit, configured to control the furnace tube device to process the test products whose batch type is the test batch, according to the product category specified in the super positive constraint rule, so as to obtain the processing parameters of the test product, wherein the product category of the test product is the same as that specified in the super positive constraint rule;

an adjustment unit, configured to adjust the furnace tube device from the testing stage to the normal operation stage, when the percentage of the number of processing parameters meeting the preset parameter requirement, in the total number of the at least one processing parameter obtained within the preset time period, exceeds a preset threshold; and a rule deletion unit, configured to delete the super positive constraint rule when the furnace tube device is in a normal operation stage.

An apparatus for managing chip manufacturing equipment is provided by an embodiment of the present application. For each furnace tube device in a target area, the processing precision of each furnace tube device is calculated, through the heating uniformity result obtained by testing the furnace tube device, the processing test result of the test piece after processed by the furnace tube device, and the factory parameters of the furnace tube device, so that after obtaining the processing precision of the furnace tube device, the processing precision label of each furnace tube device is determined. After it is detected that the first rule is set in the first furnace tube device, the target second furnace tube device with the processing precision label same as that required by the first rule is determined from at least one second furnace tube device, through determining at least one second furnace tube device with the device capability same as the first furnace tube device in the target area. Then, the priority synchronization sequence of the target second furnace tube device is determined according to the processing precision of each target second furnace tube device. According to the priority synchronization sequence, the first rule in the first furnace tube device is synchronized to the target second furnace tube device.

An apparatus is provided in the embodiment of the present application. The processing precision of each furnace tube device is calculated, through the heating uniformity result obtained by testing the furnace tube device, the processing test result of the test piece after processed by the furnace tube device, and the factory parameters of the furnace tube device. Through the processing precision label for each furnace tube device, when the rules are synchronized, the first rule in the first furnace tube device can be synchronized to the target furnace tube device in the equipment that meets the processing precision label requirement. Through determining the priority synchronization sequence of the target second furnace tube device, the first rule can be preferentially synchronized to the target second furnace tube device with relatively higher processing precision. Compared with the method of separately setting the rule for each device in the prior art, in the solution provided by the embodiments of the present application, the rule synchronization between different devices can be realized.

Figure 4:
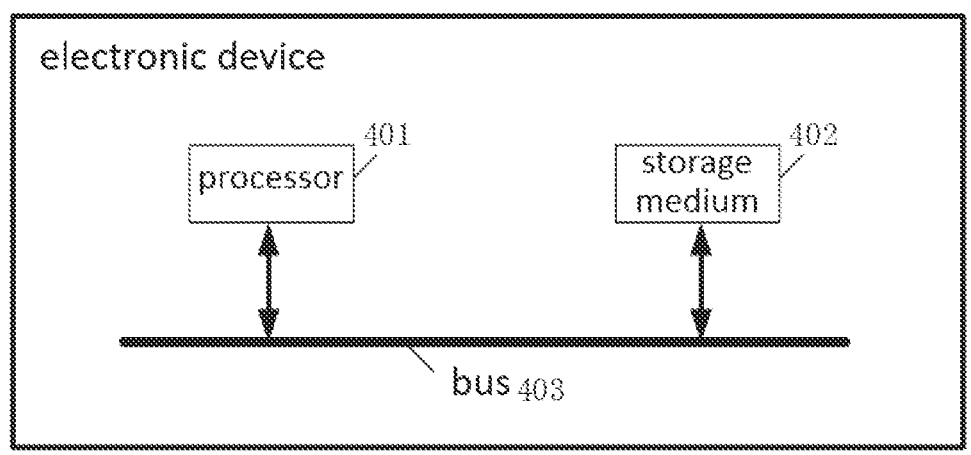
FIG. 4 shows a schematic structural diagram of an electronic device provided by an embodiment of the present application.

FIG. 4 shows a schematic structural diagram of an electronic device provided by an embodiment of the present application, including: a processor 401, a storage medium 402, and a bus 403, wherein the storage medium 402 stores a machine-readable instructions which is executable by the processor 401. When the method for managing chip manufacturing equipment in the embodiment is performed in the electronic device, the processor 401 communicates with the storage medium 402 through the bus 403, and the processor 401 executes the machine-readable instructions to execute the steps as in the embodiments.

In an embodiment, the storage medium 402 can also execute other machine-readable instructions to execute other methods described in the embodiment. The specifically executed method steps and principles may be obtained by referring to the description of the embodiment, which will not be repeated in detail here.

The embodiment of the present application further provides a computer-readable storage medium, wherein a computer program is stored on the computer-readable storage medium, and the computer program is executed when is run by a processor, to perform the steps as in the embodiments.

In the embodiments of the present application, when the computer program is run by the processor, other machine-readable instructions may also be executed, so as to execute other methods described in the embodiments. The specifically executed method steps and principles may be obtained by referring to the descriptions of the embodiments, which will not be repeated in detail here.

In the several embodiments provided in the present application, it should be understood that the disclosed system, device and method may be implemented in other manners. The device embodiments described above are only illustrative. For example, the division of the modules is only a logical function division. In actual implementation, there may be other division methods. For another example, multiple modules or components may be combined or integrated into another system, or some features can be ignored, or not implemented. On the other hand, the mutual coupling or direct coupling or communication connection, shown or discussed, may be the indirect coupling or communication connection through some communication interfaces, devices or modules, and it may be in electrical, mechanical or other forms.

The modules described as separate components may or may not be physically separated, and the components shown as modules may or may not be physical units, that is, may be located in one place, or may be distributed on multiple network units. Some or all of the units may be selected according to actual needs, to achieve the purpose of the technical solution in this embodiment.

In addition, individual functional units in each embodiment of the present application may be integrated into one processing unit, or may exist physically alone, or two or more units may be integrated into one unit.

The functions, if implemented in the form of software functional unit and sold or used as a stand-alone product, may be stored in a processor-executable non-volatile computer-readable storage medium. Based on this understanding, the technical solution of the present application in essence, or the part that contributes to the prior art or the part of the technical solution can be embodied in the form of a software product. The computer software product is stored in a storage medium, including plural instructions, which are used to cause a computer device (which may be a personal computer, a server, or a network device, etc.) to execute all or part of the steps of the methods described in the various embodiments of the present application. The aforementioned storage medium comprises: a U disk, a removable hard disk, a ROM, a RAM, a magnetic disk, or an optical disk and other mediums that can store program codes.

The above are only the specific embodiments of the present application, but the protection scope of the present application is not limited thereto. One skilled in the art, within the technical scope disclosed in the present application, can easily think of changes or replacements, which should be covered within the protection scope of the present application. Therefore, the protection scope of the present application shall be subject to the protection scope of the claims.

What is claimed is:

1. A method for managing chip manufacturing equipment, the method comprising:
    determining, for each furnace tube device in a target area, a processing precision of the furnace tube device, through a heating uniformity result obtained by testing the furnace tube device, a processing test result of a test piece after processed by the furnace tube device, and factory parameters of the furnace tube device;
    marking a processing precision label for each furnace tube device according to a processing precision of each furnace tube device;
    determining, when it is detected that a first rule is set in a first furnace tube device, at least one second furnace tube device having device capability same as the first furnace tube device in the target area, wherein the first rule comprises: product categories that are allowed to be processed by the furnace tube device, and a processing precision label required for processing each of the product categories;
    determining, from the at least one second furnace tube device, a target second furnace tube device having a processing precision label same as that required by the first rule;
    determining a priority synchronization sequence of the target second furnace tube device according to a processing precision of each target second furnace tube device; and
    synchronizing the first rule in the first furnace tube device to the target second furnace tube device according to the priority synchronization sequence.

2. The method according to claim 1, wherein after synchronizing the first rule in the first furnace tube device to the target second furnace tube device, the method further comprises:
    judging whether a target furnace tube device can process a target product, for each target furnace tube device, according to a product category of the target product, a processing precision label of the target furnace tube device and a first rule in the target furnace tube device, carried in an execution request, when the execution request sent by the target furnace tube device is received, wherein the target furnace tube device comprises the first furnace tube device and the second furnace tube device; the execution request is generated after the target furnace tube device detects arrival of the target product; the product category comprises product batch, product batch type, and product model; the processing precision label comprises a finishing label, and a rough processing label; and corresponding relationship between the product category and processing precision requirement is preset; and
    controlling the target furnace tube device to execute a processing program, when it is judged that the target furnace tube device can process the target product.

3. The method according to claim 2, wherein when the first rule is of allowing a furnace tube device whose processing precision label is the finishing label to process products of a first product category, the method further comprises:

controlling the target furnace tube device to process products of the first product category, for each target furnace tube device, when an execution request sent by the target furnace tube device is received, if a processing precision label of the target furnace tube device in the execution request is the finishing label and a product category of a target product received by the target furnace tube device is the same as the first product category.

4. The method according to claim 2, wherein when an execution request sent by the target furnace tube device is received, the method further comprises:

controlling a transport robot to transfer a target product to make it leave the target furnace tube device, if a processing precision label of the target furnace tube device in the execution request is the rough processing label, or a product category of the target product received by the target furnace tube device is different from a first product category.

5. The method according to claim 1, wherein, before detecting that the first rule is set in the first furnace tube device, the method further comprises:

judging whether an additional special negative rule is in a negative rule, for each furnace tube device, when it is detected that the negative rule is in the furnace tube device, wherein the negative rule is that the furnace tube device is not allowed to process products of a second product category; and the special negative rule is that an amount of the products of the second product category allowed to be processed by the furnace tube device is a first amount;

determining the first amount in the special negative rule, in which the furnace tube device is allowed to process the products of the second product category, if the additional special negative rule exists in the negative rule;

controlling the furnace tube device to process the products of the second product category, when a second amount, in which the products of the second product category are processed by the furnace tube device within a preset period, is smaller than the first amount; and controlling the furnace tube device to stop processing the products of the second product category, when a second amount, in which the products of the second product category are processed by the furnace tube device within the preset period, is greater than or equal to the first amount.

6. The method according to claim 1, wherein, before detecting that the first rule is set in the first furnace tube device, the method further comprises:

judging whether an additional exception rule is in a target rule, for each furnace tube device, when the target rule is set in the furnace tube device, wherein the target rule comprises a positive rule and a negative rule, and the positive rule is of allowing the furnace tube device to process products of a third product category;

determining a product batch and a product batch type in a product category specified in the exception rule, if the exception rule exists in the target rule, wherein a product model in the exception rule and a product model in the target rule are the same; and ignoring the target rule in this operation, if a product batch and a product batch type of a product to be processed are the same as the product batch and the product batch type specified in the exception rule.

7. The method according to claim 1, wherein, before detecting that the first rule is set in the first furnace tube device, the method further comprises:

determining that the furnace tube device enters a testing stage after parameter adjustment, for each furnace tube device, if a super positive constraint rule exists in the furnace tube device, wherein the super positive constraint rule is of allowing the furnace tube device to process products whose batch type in product category is of a test batch;

controlling the furnace tube device to process test products whose batch type is of the test batch, according to a product category specified in the super positive constraint rule, so as to obtain processing parameters of the test products, wherein a product category of the test products is the same as the product category specified in the super positive constraint rule;

adjusting the furnace tube device from the testing stage to a normal operation stage, when a percentage of the number of processing parameters meeting a preset parameter requirement, in the total number of at least one processing parameter obtained within a preset time period, exceeds a preset threshold; and deleting the super positive constraint rule, when the furnace tube device is in the normal operation stage.

8. An apparatus for managing chip manufacturing equipment, the apparatus comprising:

a calculating unit, configured to determine, for each furnace tube device in a target area, a processing precision of the furnace tube device, through a heating uniformity result obtained by testing the furnace tube device, a processing test result of a test piece after processed by the furnace tube device, and factory parameters of the furnace tube device;

a marking unit, configured to mark a processing precision label for each furnace tube device according to a processing precision of each furnace tube device;

a first determining unit, configured to determine, when it is detected that a first rule is set in a first furnace tube device, at least one second furnace tube device having device capability same as the first furnace tube device in the target area, wherein the first rule comprises: product categories that are allowed to be processed by the furnace tube device, and a processing precision label required for processing each of the product categories;

a screening unit, configured to determine, from the at least one second furnace tube device, a target second furnace tube device having a processing precision label same as that required by the first rule;

a sorting unit, configured to determine a priority synchronization sequence of the target second furnace tube device according to a processing precision of each target second furnace tube device; and a synchronization unit, configured to synchronize the first rule in the first furnace tube device to the target second furnace tube device according to the priority synchronization sequence.

9. An electronic device, comprising: a processor, a storage medium, and a bus, wherein the storage medium stores machine-readable instructions executable by the processor, wherein when the electronic device is running, the processor is communicated with the storage medium through the bus, and the processor executes the machine-readable instructions to execute steps of the method for managing chip manufacturing equipment according to claim 1.

* * * * *